United States Patent
Pille et al.

(10) Patent No.: US 6,629,215 B2
(45) Date of Patent: Sep. 30, 2003

(54) MULTIPLE PORT MEMORY APPARATUS

(75) Inventors: Juergen Pille, Stuttgart (DE); Rolf Sautter, Bondorf (DE); Dieter Wendel, Schoenaich (DE); George M. Lattimore, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 09/811,916

(22) Filed: Mar. 19, 2001

(65) Prior Publication Data

US 2001/0044882 A1 Nov. 22, 2001

(30) Foreign Application Priority Data

Mar. 20, 2000 (EP) ............................................. 00105819

(51) Int. Cl.[7] .............................................. G06F 12/00
(52) U.S. Cl. ...................................... 711/149; 707/203
(58) Field of Search ................................ 711/105, 154, 711/5, 211, 131, 149; 707/203

(56) References Cited

U.S. PATENT DOCUMENTS

| | | | | |
|---|---|---|---|---|
| 4,916,700 A | * | 4/1990 | Ito et al. ...................... 714/718 |
| 4,933,879 A | * | 6/1990 | Ando et al. .................. 345/550 |
| 5,359,557 A | * | 10/1994 | Aipperspach et al. .. 365/189.04 |
| 5,428,575 A | * | 6/1995 | Fudeyasu ..................... 365/201 |
| 5,600,834 A | * | 2/1997 | Howard ....................... 707/201 |
| 5,991,186 A | * | 11/1999 | Balistreri et al. ............. 365/78 |
| 6,125,371 A | * | 9/2000 | Bohannon et al. .......... 707/203 |

* cited by examiner

Primary Examiner—Hiep T. Nguyen
(74) Attorney, Agent, or Firm—Lynn L. Augspurger, Esq.; Blanche E. Schiller, Esq.; Heslin Rothenberg Farley & Mesiti P.C.

(57) ABSTRACT

In order to provide an improved wiring management approach, a multiple port memory apparatus (200) is proposed, which comprises a first memory field of a first memory array (201) of at least three memory arrays (201, 202, 203) storing first data, wherein the first memory field is identified by a first address, a first memory field of a second memory array (202) of the at least three memory arrays (201, 202, 203) storing second data, wherein the first memory field of the second memory array (202) is also identified by the first address, and a first memory field of a third memory array (203) of the at least three memory arrays (201, 202, 203) storing select data indicating, whether the first data or the second data, each stored under the first address but in different memory arrays, have been lastly written.

19 Claims, 2 Drawing Sheets

MULTIPLE PORT MEMORY APPARATUS

PRIOR FOREIGN APPLICATION

This application claims priority from European patent application number 00105819.7, filed Mar. 20, 2000, which is hereby incorporated herein by reference in its entirety.

TECHNICAL FIELD

This invention relates to a multiple port memory apparatus, a method of operating a multiple port memory apparatus, an out-of-order processing apparatus comprising such memory apparatus, a data processing system comprising said out-of-order processing apparatus and a data processing system carrying out said method.

BACKGROUND ART

A multiple port memory comprises a plurality of ports. Such memory can be a random access memory (RAM) or a static random access memory (SRAM). Generally, each port represents an independent input and/or output path for writing data into the memory. A multiple port memory may, for example, comprise several write ports and read ports but the number of write ports need not to be the same as the number of read ports.

When attempting to increase the number of the write ports of a multiple port memory, the complexity of the wiring and the percentage of the area needed for the wiring with regard to the total area needed for the memory cell transistors and the wiring grows with the square to the number of the ports.

Particularly, in data processors comprising a plurality of multiple port memories, multiple port registers or multiple port arrays, the die area occupied by the memories, registers or arrays comprising a large number of ports is usually determined by the area needed for wiring rather than by the area needed for the transistors forming them.

Therefore, there is a need for an improved wiring management approach for multiple port registers and multiple port memory arrays.

SUMMARY OF THE INVENTION

In order to reduce the chip area needed when increasing the number of the write ports of a multiple port memory array with K write ports and L read ports (K=2, 3, 4, . . . and L=1, 2, 3, . . . ), the present invention proposes to substitute such a multiple port memory array by two or more multiple port memory arrays and a selection device. The two or more multiple port memories are chosen to comprise in total K write ports and each multiple port memory array comprises a subset of the total numbers of write ports and L read ports.

In a preferred embodiment of the invention, the two or more multiple write port memory arrays all comprise the same number and the same addresses available for writing data into them. Since it has to be determined, whether first data written into a specific address of a first multiple port memory array are younger or older than second data written into the same specific address but of a second or further multiple port memory array, the invention proposes to use a selection device. The selection device according to the invention stores for each available address for the two or more multiple port memory arrays, into which of them data have been lastly written.

In another preferred embodiment of the invention, the selection device comprises a multiple port memory array. Preferably, the multiple port memory array of the selection device comprises the same number of addresses and the same addresses as each of the two or more multiple port memory arrays for data storage, wherein the two or more multiple port memory arrays are preferably all the same.

In a further preferred embodiment of the invention, each write port of the memory array of the selection device is connected with a different write port of the two or more multiple port memory arrays and the one or more addresses applied to the two or more multiple port memory arrays at one or more write cycles is also applied to the multiple port memory array of the selection device. The selection device stores one or more control bits under the address applied to its one or more address inputs indicating via which write port of the two or more multiple port memory arrays and/or into which memory array data have been written at last into the specific address of the two or more multiple port memory arrays. For example, if the multiple port memory apparatus according to the invention comprises two multiple port memory arrays for data storage, only a single control bit either with a high-level or a low-level has to be stored for each address of the two multiple port memory arrays. The single control bit is stored in the memory array of the selection device and allows to indicate into which of the two multiple port memory arrays data have been written at last for a specific address. Accordingly, the storage capacity of the memory array of the selection device per address comprises only a single bit.

It will be understood that the storage capacity per address has to be enlarged to two or more control bits, if more than two multiple port memory arrays are used, in order to be able to indicate by the stored control bits into which of the more than two multiple port memory arrays for data storage data have been lastly written.

In yet a further preferred embodiment of the invention, the selection device of the multiple port memory apparatus according to the invention comprises a set of multiplexers. The inputs of each of the multiplexers are connected with a read port of the different multiple port memory arrays for data storage and a further select input of each of the multiplexers is connected with a different read port of the memory array of the selection device. When applying the one or more control bits to the select input of each of the multiplexers during a read process, the control bits control each multiplexer to output only the data stored in the two or more multiple port memory arrays for data storage for a specific address, which have been lastly written.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1:
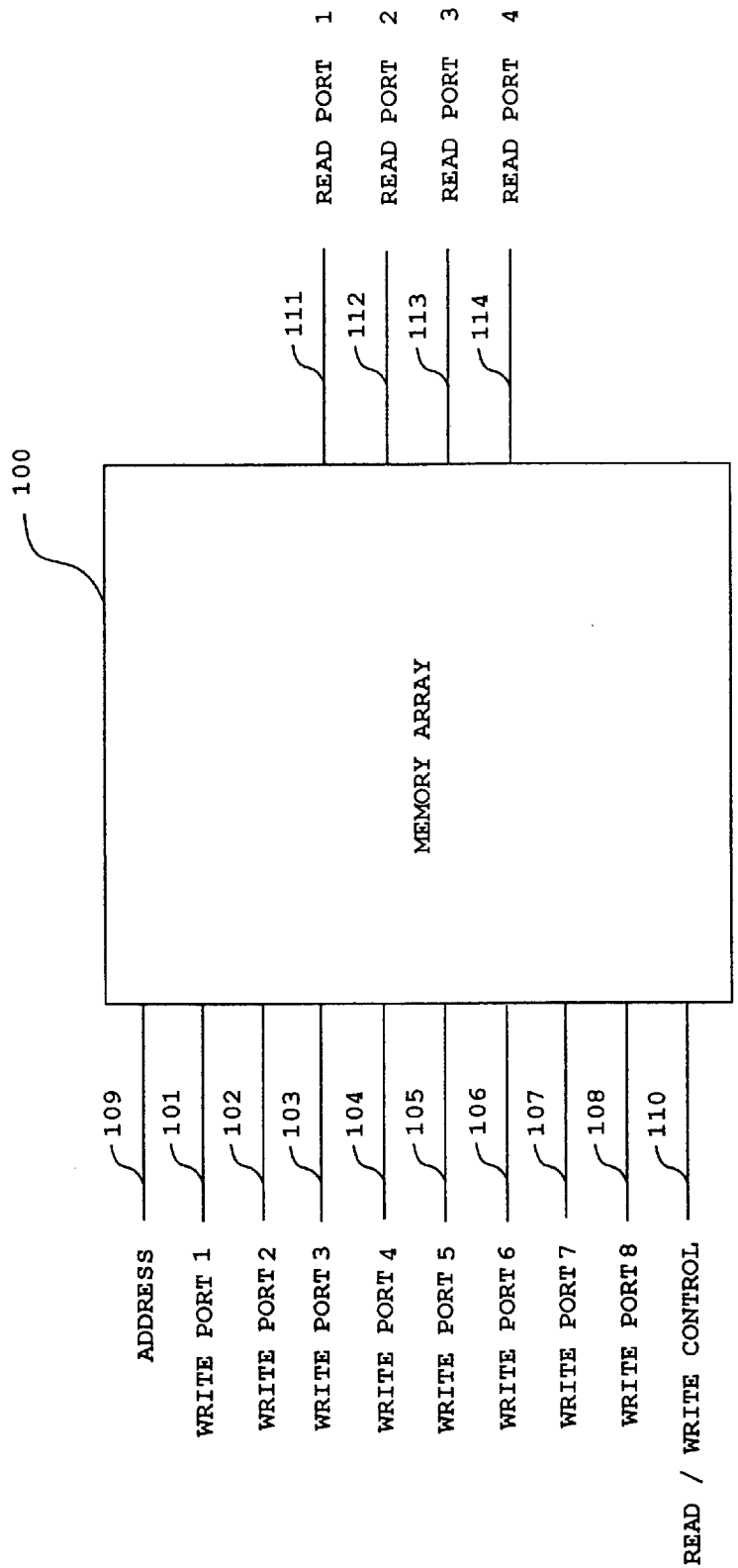
FIG. 1 is a generalized block diagram of a known multiple port array.

An example of a known multiple port memory array 100 is depicted in FIG. 1. The multiple port memory array 100 comprises eight write ports 1 to 8 (101 to 108), an address port 109 and a read/write control port 110 as well as four read ports 1 to 4 (111 to 114).

Figure 2:
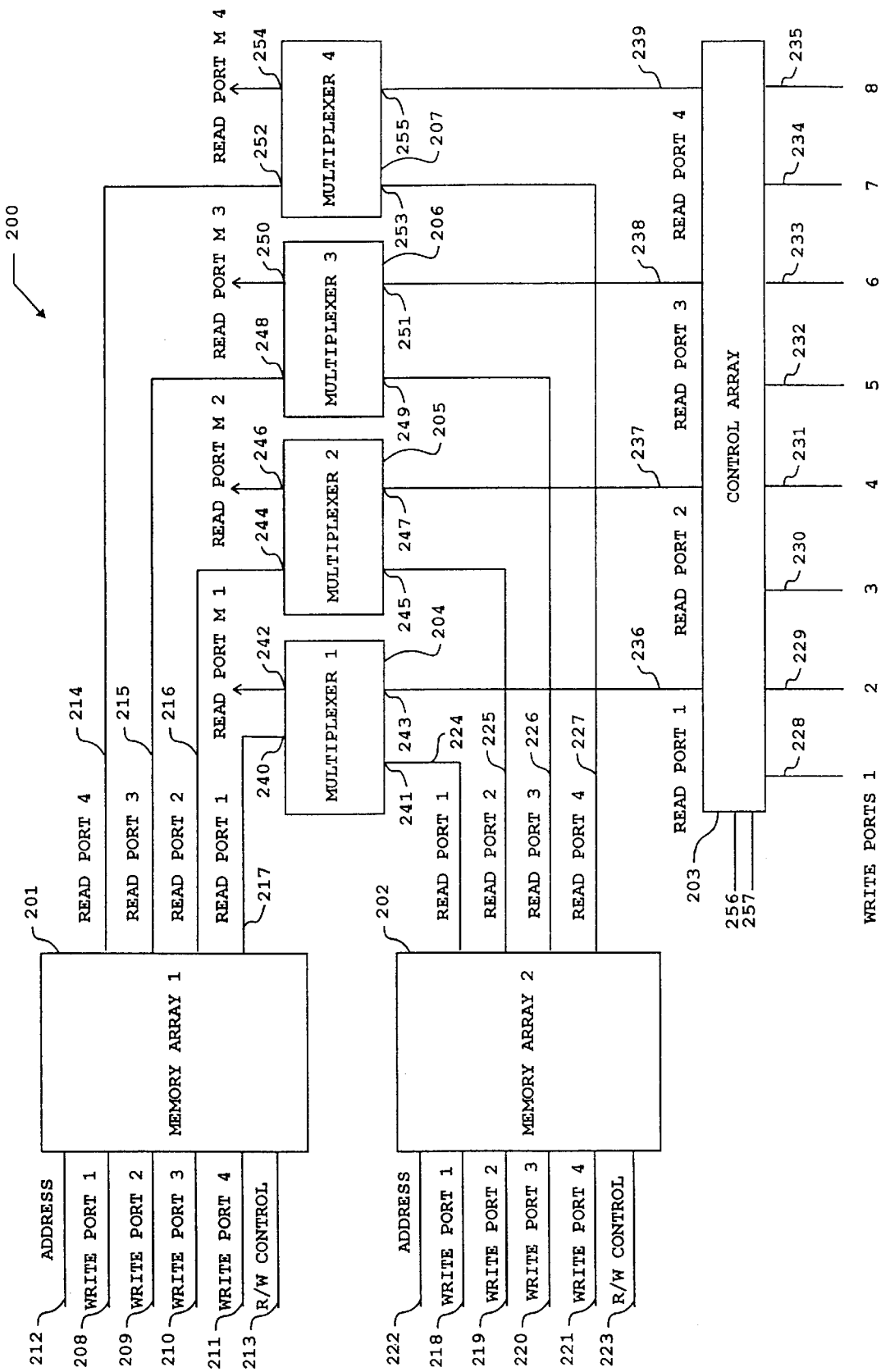
FIG. 2 is a generalized block diagram of a multiple port memory apparatus according to the invention comprising the same functionality as the multiple port array shown in FIG. 1.

FIG. 2 shows a multiple port memory apparatus 200 according to the invention, which comprises the same functionality as the multiple port memory array shown in FIG. 1. The multiple port memory apparatus 200 comprises a memory array 1 (201), a memory array 2 (202), a control array 203, a multiplexer 1 (204), a multiplexer 2 (205), a multiplexer 3 (206) and a multiplexer 4 (207).

The memory array 1 (201) comprises four write ports 1 to 4 (208 to 211) and four read ports 1 to 4 (214 to 217) as well as an address port 212 and a read/write control port 213.

The memory array 2 (202) is identical to the memory array 1 (201) and comprises four write ports 1 to 4 (218 to 221), four read ports 1 to 4 (224 to 227), an address port 222 and a read/write control port 223.

The control array 203 comprises eight write ports 1 to 8 (228 to 235), four read ports 1 to 4 (236 to 239), an address port 256 and a read/write control port 257.

The multiplexer 1 comprises two data inputs 240 and 241, one output named as read port M 1 (242) and a select input 243, the multiplexer 2 comprises two data inputs 244 and 245, one output 246 named as read port M 2 and a select input 247, the multiplexer 3 comprises two data inputs 248 and 249, one output 250 named as read port M 3 and a select input 251, and the multiplexer 4 comprises two data inputs 252 and 253, one output 254 named as read port M 4 and a select input 255.

The read port 4 (214) of the memory array 1 (201) is connected with the data input 252 of the multiplexer 4 (207), the read port 3 (215) of the memory array 1 (201) is connected with the data input 248 of the multiplexer 3 (206), the read port 2 (216) of the memory array 1 (201) is connected with the data input 244 of the multiplexer 2 (205), and the read port 1 (217) is connected with the data input 240 of the multiplexer 1 (204).

The read port 1 (224) of the memory array 2 (202) is connected with the data input 241 of the multiplexer 1 (204), the read port 2 (225) of the memory array 2 (202) is connected with the data input 245 of the multiplexer 2 (205), the read port 3 (226) of the memory array 2 (202) is connected with the data input 249 of the multiplexer 3 (206) and the read port 4 (227) of the memory array 2 (202) is connected with the data input 253 of the multiplexer 4 (207).

The read port 1 (236) of the control array 203 is connected with the select input 243 of the multiplexer 1 (204), the read port 2 (237) of the control array 203 is connected with the select input 247 of the multiplexer 2 (205), the read port 3 (238) of the control array 203 is connected with the select input 251 of the multiplexer 3 (206), and the read port 4 (239) of the control array 203 is connected with the select input 255 of the multiplexer 4 (207).

In the following the function of the multiple port memory apparatus 200 according to the invention will be described in detail. With regard to FIG. 1 it shall be assumed that each data processing unit (not shown) of a plurality of eight data processing units (not shown) is connected to a different write port of the write ports 1 to 8 (101 to 108) of the known memory array 100.

When applying one or more appropriate write control signals to the read/write control port 110, each of the data processing units is able to write and store data simultaneously or parallel under a specific address out of the available addresses, which has been applied to the corresponding write port. This is realized by applying one or more appropriate address signals to the address port 109 of the known memory array 100. Via each of the write ports 1 to 8 (101 to 108) data can be written into any of the addresses of the known memory array 100. The only measure, which has to be taken, is that data are not written into the same address at the same time or step or clock cycle via different write ports. Otherwise, the data contents stored under such an address would be indefinite as known by those skilled in the art.

If via write port 1 (101) data are written and stored under address number 1 in a first step or clock cycle and in a second step or clock cycle data are written into the same address either via the write port 1 (101) or any other of the write ports 2 to 8, the old data will be overwritten by the new data.

When applying one or more appropriate read control signals to the read/write control port 110 and one or more addresses to the address port 109 of the known memory array 100, via each of the read ports 1 to 4 (111 to 114) data can be read simultaneously or parallel via the read ports 1 to 4 of the known memory array 100 by a plurality of further data processing units (not shown), each connected with one read port of the read ports 1 to 4 (111 to 114). The restriction with regard to the writing process that only a single unit may simultaneously write into the same address does not apply with regard to reading data out of the known memory array 100.

If in a third step or clock cycle the data stored under address number 1 are read via one or more of the read ports 1 to 4 (111 to 114) of the known memory array 100, the data, which are written in the second step or clock cycle into address number 1, i.e. the latest or youngest data stored under address number 1, are read.

Now it shall be assumed that in a first step or clock cycle data are written in similar manner via write port 1 (208) into address number 1 of the memory array 1 (201) of the multiple port memory apparatus 200 according to the invention by a data processing unit (not shown) of a plurality of eight processing units (not shown) and each being connected with a different write port of the write ports 208 to 211 and 218 to 221 of both memory arrays 1 and 2 (201 and 202).

In a second step or clock cycle data shall be written in similar manner via write port 1 (218) or another of the write ports 1 to 4 (218 to 221) of the memory array 2 (202) into address number 1 of the memory array 2 (202). Obviously, without further measures, which will be described later on, it is not possible to determine, whether the data stored in address number 1 of the memory array 1 or the data stored in address number 1 of the memory array 2 are the latest or youngest data for address number 1, since in contrast to the known memory array 100 also comprising eight write ports, the data are stored in different physical memory arrays and thus are not overwritten in the second step, when writing into the same address.

In order to allow this determination, the present invention proposes to use a control array, which stores into which of the memory arrays 1 or 2 of the multiple port memory apparatus 200 data have been written for each of the available addresses in both memory arrays data at last. In this example, control array 203 would store in the first step or clock cycle first so-called select data, indicating that data have been written into address number 1 of the memory array 1 and preferably the old or first select data would be overwritten in the second step or clock cycle by second select data, indicating that data have been written into address number 1 of the memory array 2. By doing so, it can be determined, which data present under the same address but in different two or more memory arrays is the most recent and valid data for further processing.

Each of the write ports 1 to 8 (228 to 235) of the control array 203 is connected with the corresponding write port of the write ports 1 to 4 (208 to 211) of the memory array 1 (201) and of the write ports 1 to 4 (218 to 221) of the memory array 2 (202) (not shown). In addition, the address signals are applied to the address port 256 of the control array 203 when writing into memory array 1 (201) or the memory array 2 (202) (not shown). To allow writing into the control array 203, an appropriate write signal is applied to the read/write control port 257 of the control array 203.

Accordingly, in the first step or clock cycle when writing into address number 1 of the memory array 1 via write port 1 (208) of the memory array 1 of the data applied to the write port 1 (208) of the memory array 1 simultaneously the data to be stored in memory array 1 are applied to the write port 1 (228) of the control array 1 and the address applied to the the address port 212 of the memory array 1 is applied to the address port 256 of the control array 203 and the control array stores a control bit, such as a high-level signal, under the address number 1 in the control array 203 indicating that data have been written into memory array 1.

In the second step or clock cycle when writing into address number 1 of the memory array 2 via write port 1 (218) of the memory array 2 of the data applied to the write port 1 (218) of the memory array 2 simultaneously the data to be stored in memory array 2 are applied the write port 5 (232) of the control array 203 and the address applied to the address port 222 of the memory array 2 is applied to the address port 256 of the control array 203 and the control array stores the changed control bit, such as a low-level signal, under the address number 1 in the control array 203 indicating that data have been written into memory array 2. Accordingly, it is preferred to overwrite the high-level signal stored in the first step by a low-level signal in the second step. The same applies for all other write ports of the memory array 1 and memory array 2 and their available addresses.

In a preferred embodiment of the invention as shown in FIG. 2, the control array 203 is a memory array comprising the same number of addresses as the memory array 1 and the memory array 2, i.e. the control array 203, the memory array 1 and the memory array 2 all comprise the same number of available addresses for data storage. In contrast to the memory array 1 and the memory array 2, the storage capacity for each address in the control array 203 is much smaller than the storage capacity for each address in the memory array 1 and the memory array 2. Preferably, the storage capacity for each address in the control array 203 is only one bit per address, sufficient for storing the indication into which memory array of the memory arrays 1 or 2 data have been lastly written.

In order to make the data, which have been lastly written into the same address either in the memory array 1 or in the memory array 2, available for further processing by one or more data processing units (not shown) connected to one or more of the read ports M1 to M4 (242, 246, 250, 254), the address or addresses of the data which shall be outputted is applied to the memory array 1 (201), the memory array 2 (202) and the control array 203.

It shall now be assumed, as an example, that the data lastly stored under address number 1 either in the memory array 1 or in the memory array 2 shall be outputted via multiplexer 1. In this example, in the third step, a read control signal is applied to the read/write control port 213 of the memory array 1, to the read/write control port 223 of the memory array 2 and to the read/write control port 257 of the control array 203 and the address number 1 is applied to the address port 212 of the memory array 1 (201), the address port 222 of the memory array 2 (202) and the address port 256 of the control array 203. As to be seen from FIG. 2, the data stored under address number 1 in the memory array 1 (201) is applied to the data input 240 of the multiplexer 1 via the read port 1 (217), while the data stored under address number 1 in the memory array 2 is applied to the data input 241 of the multiplexer 1 via the read port 1 (224) of the memory array 2 (202) and the control bit stored in the control array 203 is applied to the select input 243 of the multiplexer 1 via the read port 1 (236) of the control array 203.

Depending on the status of the control bit stored under the address number 1 in the control array 203, indicating into which memory array of the two memory arrays 1 or 2 (201, 202) data has been lastly stored, the multiplexer 1 (204) outputs either the data on its input 240 or on its input 241 at its read port M 1 (242) for further processing. As will be seen from FIG. 2, the corresponding applies for the other read ports and their corresponding multiplexers for all addresses available in the memory arrays 1 and 2.

In a preferred embodiment of the invention, each of the memory arrays 1 and 2 (201 and 202) is chosen from memory arrays comprising an optimum with regard to the smallest chip area needed.

From the foregoing it will be understood that a memory array, such as the one shown in FIG. 1, comprising a plurality of write ports and/or read ports can be substituted by a multiple port memory apparatus according to the invention. The multiple port memory apparatus according to the invention comprises two or more memory arrays, which in total require a smaller wiring area than the memory array to be substituted, a control array for storing one or more control bits in terms of the storage capacity and one multiplexer for each two or more corresponding read ports of the memory arrays, as explained. This allows to substitute a known multiple port memory array by a multiple port memory apparatus according to the invention, which has the same functionality but requires a smaller chip area.

Instead of one or more of the control bits, another indication, such as a time stamp or a unique identifier added to the data stored in the memory arrays, could be used to control that the data for a given address are outputted via multiplexers, which have been lastly written either in memory array 1 or in memory array 2. As an example, the indication could be stored in the memory arrays and/or in the control array.

In contrast to the prior art, when attempting to increase the number of the ports of a multiple port memory, the complexity of the wiring and the percentage of the chip area needed for the wiring with regard to the total chip area needed for the memory cell transistors and the wiring does not grow with the square to the number of the write ports. Instead, the chip area needed for the wiring grows almost linear with the number of the write ports. It is only almost linear, since a very small storage capacity and a corresponding chip area for building the control bit storage capacity with regard to the chip area needed for known memory arrays comprising the same amount of read and write ports and the same data storage capacity as well as a very small chip area for building the multiplexers is needed.

This is of particular importance, if one or more multiple port memory apparatus according to the invention shall be implemented on a single chip or die comprising one or more data processing units and/or processors, such as one or more so-called out-of-order processors, as known by those skilled in the art. In such applications, the available chip area is very limited for implementing all required functionality.

From the foregoing it will be understood that any multiple port memory array comprising K write ports (K 32 1, 2, 3, . . . ) and L read ports (L=1, 2, 3, . . . ) may be substituted by a multiple port memory apparatus according to the invention. Such a multiple port memory apparatus comprises M multiple port memory arrays (M=2, 3, 4, . . . ), which in total comprise a number of K write ports and each of the multiple port memory arrays comprises a number of L read ports. In addition, the multiple port memory apparatus according to the invention comprises a number of L multiplexers and one or more control arrays, which in total comprise a number of K write ports and a number of L read ports. The corresponding read port of each of the M multiple port memory arrays is applied to the same multiplexer of the totality of L multiplexers as well as to the corresponding read port of the control array, whereby the corresponding read port of the control array controls the corresponding multiplexer to output that data of that multiple port memory array into which data have been lastly written and which are stored under the same address present in all M multiple port memory arrays.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of operating a multiple port memory apparatus comprising at least two memory arrays, each memory array comprising a plurality of addressable memory fields, at least one write port for writing data into said memory fields, and at least one read port for reading data stored in said memory fields, and wherein said method comprises:

writing first data into a first memory field of a first memory array of said at least two memory arrays of the multiple port memory apparatus, wherein said first memory field is identified by a first address; and writing second data into a first memory field of a second memory array of said at least two memory arrays of the multiple port memory apparatus, wherein said first memory field of said second memory array is also identified by said first address.

2. The method of claim 1, further comprising writing select data indicating whether said first data or said second data have been lastly written.

3. The method of claim 2, wherein said select data are written into a first memory field of a third memory array of the multiple port memory apparatus.

4. The method of claim 3, wherein said first memory field of said third memory array is also identified by said first address.

5. The method of claim 2, wherein said select data are added to said first data and/or to said second data and/or are stored in said first and/or said second memory field.

6. The method of claim 5, wherein said select data comprise or represent a unique identifier identifying said first and/or said second data.

7. The method of claim 5, wherein said select data comprise or represent a time stamp indicating the date of said first and/or said second data.

8. The method of claim 2, wherein said memory apparatus comprises at least one selection device being controlled by said select data to output said first data, if said first data have been lastly written with regard to said second data or vice versa.

9. The method of claim 8, wherein said selection device comprises a multiplexer.

10. A data processing system for operating a multiple port memory apparatus comprising at least two memory arrays, each memory array comprising a plurality of addressable memory fields, at least one write port for writing data into said memory fields, and at least one read port for reading data stored in said memory fields, said data processing system comprising:

means for writing first data into a first memory field of a first memory array of said at least two memory arrays of the multiple port memory apparatus, wherein said first memory field is identified by a first address; and means for writing second data into a first memory field of a second memory array of said at least two memory arrays of the multiple port memory apparatus, wherein said first memory field of said second memory array is also identified by said first address.

11. The data processing system of claim 10, further comprising means for writing select data indicating whether said first data or said second data have been lastly written.

12. The data processing system of claim 11, wherein said select data are written into a first memory field of a third memory array of the multiple port memory apparatus.

13. The data processing system of claim 12, wherein said first memory field of said third memory array is also identified by said first address.

14. The data processing system of claim 11, wherein said select data are added to said first data and/or to said second data and/or are stored in said first and/or said second memory field.

15. The data processing system of claim 14, wherein said select data comprise or represent a unique identifier identifying said first and/or said second data.

16. The data processing system of claim 14, wherein said select data comprise or represent a time stamp indicating the date of said first and/or said second data.

17. The data processing system of claim 11, wherein said multiple port memory apparatus comprises at least one selection device being controlled by said select data to output said first data, if said first data have been lastly written with regard to said second data or vice versa.

18. An out-of-order processing apparatus comprising:
   means for writing first data into a first memory field of a first memory array of at least two memory arrays of a multiple port memory apparatus, wherein said first memory field is identified by a first address; and
   means for writing second data into a first memory field of a second memory array of said at least two memory arrays of the multiple port memory apparatus, wherein said first memory field of said second memory array is also identified by said first address.

19. A multiple port memory apparatus comprising:
   at least two memory arrays of a multiple port memory apparatus, each memory array comprising a plurality of addressable memory fields;
   means for writing first data into a first memory field of the first memory array of said at least two memory arrays of the multiple port memory apparatus, wherein said first memory field is identified by a first address; and
   means for writing second data into a first memory field of a second memory array of said at least two memory arrays of the multiple port memory apparatus, wherein said first memory field of said second memory array is also identified by said first address.

* * * * *